(12) United States Patent
Mankos et al.

(10) Patent No.: US 6,870,172 B1
(45) Date of Patent: Mar. 22, 2005

(54) MASKLESS REFLECTION ELECTRON BEAM PROJECTION LITHOGRAPHY

(75) Inventors: Marian Mankos, Palo Alto, CA (US); Harald F. Hess, La Jolla, CA (US); David L. Adler, San Jose, CA (US); Kirk J. Bertsche, San Jose, CA (US)

(73) Assignee: KLA-Tencor Technologies Corporation, Milpitas, CA (US)

(*) Notice: Subject to any disclaimer, the term of this patent is extended or adjusted under 35 U.S.C. 154(b) by 0 days.

(21) Appl. No.: 10/851,040

(22) Filed: May 21, 2004

(51) Int. Cl.$^7$ ............................................. H01J 37/317
(52) U.S. Cl. ............................... 250/492.22; 250/492.23
(58) Field of Search ..................... 250/492.22, 492.23, 250/492.2, 396 R

(56) References Cited

U.S. PATENT DOCUMENTS

| | | | |
|---|---|---|---|
| 5,136,169 A | * | 8/1992 | Smith et al. ............ 250/491.1 |
| 6,177,218 B1 | | 1/2001 | Felker et al. |
| 6,207,965 B1 | | 3/2001 | Koike |
| 6,235,450 B1 | | 5/2001 | Nakasuji |
| 6,291,119 B2 | | 9/2001 | Choi et al. |
| 6,333,508 B1 | | 12/2001 | Katsap et al. |
| 6,414,313 B1 | | 7/2002 | Gordon et al. |
| 6,429,443 B1 | | 8/2002 | Mankos et al. |
| 6,511,048 B1 | | 1/2003 | Sohda et al. |
| 6,525,328 B1 | | 2/2003 | Miyoshi et al. |
| 6,573,516 B2 | | 6/2003 | Kawakami |
| 6,586,733 B1 | | 7/2003 | Veneklasen et al. |
| 6,605,811 B2 | | 8/2003 | Hotta et al. |
| 6,610,890 B1 | | 8/2003 | Garcia de Quesada Fort et al. |
| 6,657,211 B2 | | 12/2003 | Benner |
| 6,674,086 B2 | | 1/2004 | Kamada |

* cited by examiner

Primary Examiner—Kiet T. Nguyen
(74) Attorney, Agent, or Firm—Okamoto Benedicto LLP

(57) ABSTRACT

One embodiment disclosed relates to an apparatus for reflection electron beam lithography. An electron source is configured to emit electrons. The electrons are reflected to a target substrate by portions of an electron-opaque patterned structure having a lower voltage level and are absorbed by portions of the structure having a higher voltage level. Another embodiment relates to a novel method of electron beam lithography. An incident electron beam is formed and directed to an opaque patterned structure. Electrons are reflected from portions of the structure having a lower voltage level applied thereto and are absorbed by portions of the structure having a higher voltage level applied thereto. The reflected electrons are directed towards a target substrate to form an image and expose a lithographic pattern.

34 Claims, 6 Drawing Sheets

MASKLESS REFLECTION ELECTRON BEAM PROJECTION LITHOGRAPHY

BACKGROUND OF THE INVENTION

1. Field of the Invention

The present invention relates generally to semiconductor manufacturing and related technologies. More particularly, the present invention relates to electron beam lithography.

2. Description of the Background Art

As is well-understood in the art, a lithographic process includes the patterned exposure of a resist so that portions of the resist can be selectively removed to expose underlying areas for selective processing such as by etching, material deposition, implantation and the like. Traditional lithographic processes utilize electromagnetic energy in the form of ultraviolet light for selective exposure of the resist. As an alternative to electromagnetic energy (including x-rays), charged particle beams have been used for high resolution lithographic resist exposure. In particular, electron beams have been used since the low mass of electrons allows relatively accurate control of an electron beam at relatively low power and relatively high speed. Electron beam lithographic systems may be categorized as electron-beam direct write (EBDW) lithography systems and electron beam projection lithography systems.

In EBDW lithography, the substrate is sequentially exposed by means of a focused electron beam, wherein the beam either scans in the form of lines over the whole specimen and the desired structure is written on the object by corresponding blanking of the beam, or, as in a vector scan method, the focused electron beam is guided over the regions to be exposed. The beam spot may be shaped by a diaphragm. EBDW is distinguished by high flexibility, since the circuit geometries are stored in the computer and can be optionally varied. Furthermore, very high resolutions can be attained by electron beam writing, since electron foci with small diameters may be attained with electron-optical imaging systems. However, it is disadvantageous that the process is very time-consuming, due to the sequential, point-wise writing. EBDW is therefore at present mainly used for the production of the masks required in projection lithography.

In electron beam projection lithography, analogously to optical lithography, a larger portion of a mask is illuminated simultaneously and is imaged on a reduced scale on a wafer by means of projection optics. Since a whole field is imaged simultaneously in electron beam projection lithography, the attainable throughputs can be markedly higher in comparison with electron beam writers. Disadvantages of conventional electron beam projection lithography systems includes that a corresponding mask is necessary for each structure to be exposed. The preparation of customer-specific circuits in small numbers is not economic, because of the high costs associated with mask production.

SUMMARY

Figure 1:
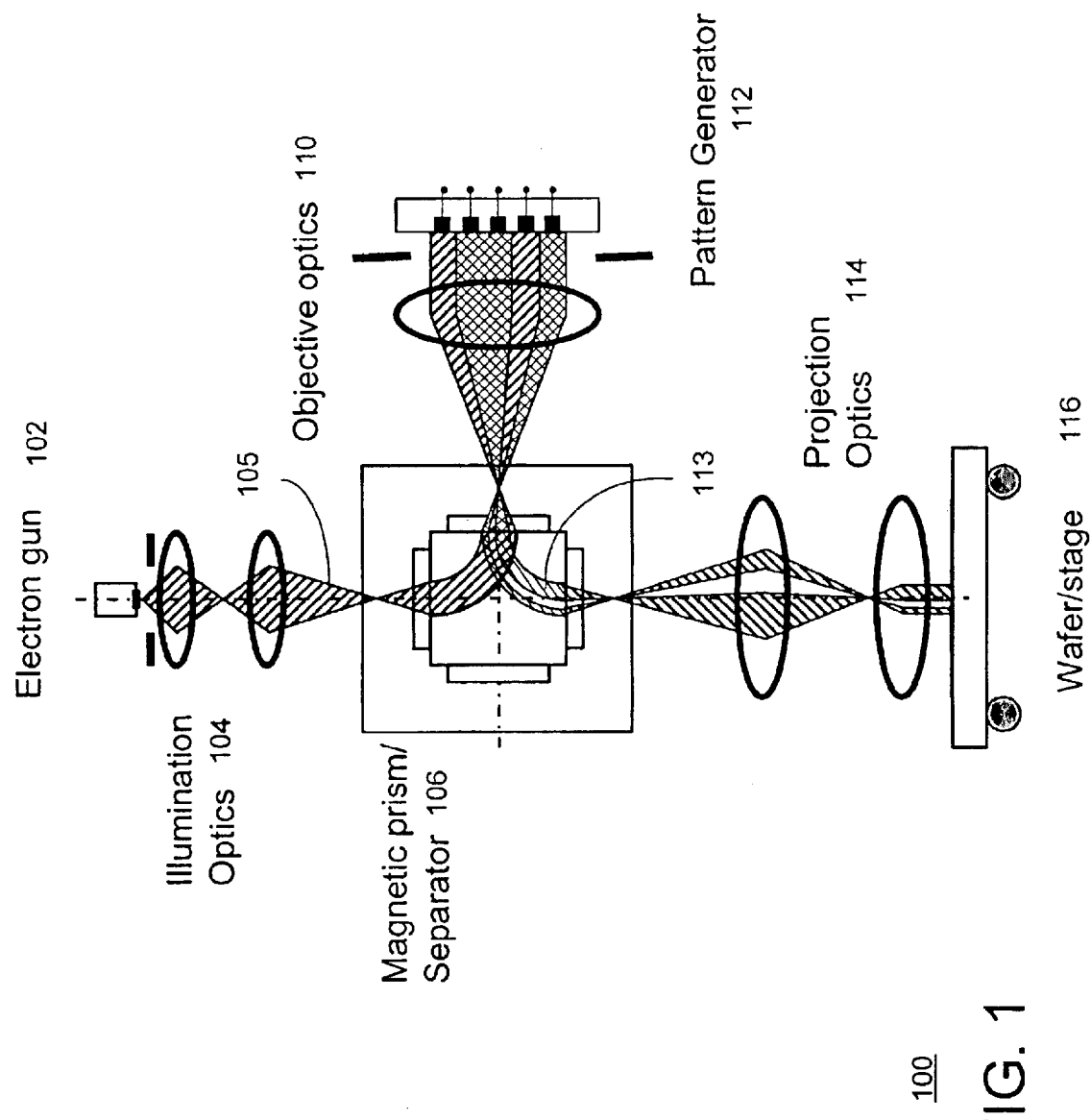
FIG. 1 is a schematic diagram of a maskless reflection electron beam projection lithography system in accordance with an embodiment of the invention.

One embodiment of the invention pertains to an apparatus for reflection electron beam lithography. An electron source is configured to emit electrons. The electrons are reflected to a target substrate by portions of an electron-opaque patterned structure having a lower voltage level and are absorbed by portions of the patterned structure having a higher voltage level.

Another embodiment pertains to a novel method of electron beam lithography. An incident electron beam is formed and directed to an opaque patterned structure. Electrons are reflected from portions of the structure having a lower voltage level applied thereto and are absorbed by portions of the structure having a higher voltage level applied thereto. The reflected electrons are directed towards a target substrate to imprint a lithographic pattern.

DETAILED DESCRIPTION

As discussed above, electron-beam direct write (EBDW) lithography has the potential to achieve excellent resolution. However, EBDW has a traditional problem relating to its low throughput. For example, it may take ten to one hundred hours to inscribe an entire wafer using EBDW lithography. One previous approach to attempt to increase the throughput is by increasing the beam current. However, when the current density exceeds a certain threshold, electron-electron interactions cause the beam to blur.

This patent application discloses a system and method of electron beam lithography that overcomes the above-discussed disadvantages and problems. Rather than focusing the electron beam into a tiny spot, the approach described herein floods the wafer with the electron beam. This enables use of a high beam current while keeping the beam current density at a level consistent with minimal electron-electron interactions. For example, an area roughly 0.1 millimeters (mm) wide may be illuminated. That area is several orders of magnitude larger than a traditional EBDW system that focuses the beam into a much smaller spot, for example, with a spot size on the order of tens of nanometers (nm) wide.

A flood beam 0.1 mm wide would normally not provide a writing resolution sufficiently high for practical use in integrated circuit manufacturing. However, the system and method disclosed herein enables high-resolution writing by partitioning the flood beam into a multitude (for example, four million) of independently controllable beams.

While others have tried building multiple columns with multiple sources to achieve multiple beams, there are various difficulties in that approach, including the difficulty of making the multiple columns behave uniformly. The system and method disclosed herein may be implemented using a single column and a single source.

A conventional multi-beam system would require a large array of blankers to achieve a multitude of controllable beams from a single column, each blanker being a small and independently controllable element that can be switched on and off rapidly. However, it is quite problematic to build and control such a large array. For example, a blanker array for a conventional multi-beam system is not normally buildable using integrated circuits because such integrated circuits are opaque to electrons.

The system and method disclosed herein re-directs the beam out of the direct line of sight between the electron source and the semiconductor wafer. Independently-controllable voltages are applied to cells of a dynamic pattern generator array that may be implemented using integrated circuit technology. The voltages determine whether each cell reflects electrons onto the wafer or absorbs electrons (preventing them from being reflected onto the wafer).

The system and method disclosed herein advantageously breaks through the traditional EBDW speed-versus-resolution tradeoff by illuminating a large area and simultaneously exposing a multitude of pixels on the wafer. For example, four million pixels may be exposed using a 4000× 1000 array of individually addressable elements. This may be achieved using a single column and a conventional electron source.

FIG. 1 is a schematic diagram of a maskless reflection electron beam projection lithography system 100 in accordance with an embodiment of the invention. The name may be abbreviated to a reflection electron beam lithography or REBL system. As depicted, the system 100 includes an electron source 102, illumination electron-optics 104, a magnetic prism 106, an objective electron lens 110, a dynamic pattern generator (DPG) 112, projection electron-optics 114, and a stage 116 for holding a wafer or other target to be lithographically patterned. In accordance with an embodiment of the invention, the various components of the system 100 may be implemented as follows.

The electron source 102 may be implemented so as to supply a large current at low brightness (current per unit area per solid angle) over a large area. The large current is to achieve a high throughput rate. Preferably, the material of the source 102 will be capable of providing a brightness of about $10^4$ or $10^5$ A/cm² sr (Amperes per cm² steradian). One implementation uses LaB$_6$, a conventional electron emitter, which typically have a brightness capability of about $10^8$ A/cm² sr, as the source material. Another implementation uses tungsten dispenser emitters, which typically have a brightness capability of about $10^5$ A/cm² sr when operating at 50 kilovolts, as the source material. Other possible emitter implementations include a tungsten Schottky cathode, or heated refractory metal disks (i.e. Ta).

The electron source 102 may be further implemented so as to have a low energy spread. The REBL system 100 should preferably control the energy of the electrons so that their turning points (the distance above the DPG 112 at which they reflect) are relatively constant, for example, to within about 100 nanometers. To keep the turning points to within about 100 nanometers, the electron source 102 would preferably have an energy spread no greater than 0.5 electron volts (eV). LaB$_6$ emitters have typical energy spreads of 1 to 2 eV, and tungsten dispenser emitters have typical energy spreads of 0.2–0.5 eV. In accordance with one embodiment of the invention, the source 102 comprises a LaB$_6$ source or tungsten Schottky emitter that is operated a few hundred degrees C. below its normal operating temperature to reduce the energy spread of the emitted electrons. However, cooler operating temperatures can destabilize the source 102, for example, due to impurities settling on the source surface and thereby diminishing its reliabilty and stability. Therefore, the source material may be preferably selected to be a material in which impurities are unlikely to migrate to the surface and choke off emission. Moreover, the vacuum on the system may be made stronger to overcome the impurity problem. Conventional lithography systems operate at a vacuum of $10^{-6}$ Torr. A scanning electron microscope (SEM) with a LaB$_6$ source typically operates at $10^{-7}$ Torr. A SEM with a Schottky emitter typically operates at $10^{-9}$ Torr or better in the gun region. In accordance with one implementation, the REBL operates with a gun region vacuum of $10^{-9}$ Torr or lower to protect the stability of the source 102.

The illumination electron-optics 104 is configured to receive and collimate the electron beam from the source 102. The illumination optics 104 allows the setting of the current illuminating the pattern generator structure 112 and therefore determines the electron dose used to expose the substrate. The illumination optics 104 may comprise an arrangement of magnetic and/or electrostatic lenses configured to focus the electrons from the source 102 so as to generate an incident electron beam 105. The specific details of the arrangement of lenses depend on specific parameters of the apparatus and may be determined by one of skill in the pertinent art.

The magnetic prism 106 is configured to receive the incident beam 105 from the illumination optics 104. When the incident beam traverses the magnetic fields of the prism, a force proportional to the magnetic field strengths acts on the electrons in a direction perpendicular to their trajectory (i.e. perpendicular to their velocity vectors). In particular, the trajectory of the incident beam 105 is bent towards the objective lens 110 and the dynamic pattern generator 112. In a preferred embodiment, the magnetic prism 106 is configured with a non-uniform magnetic field so as to provide stigmatic focusing, for example, as disclosed in U.S. patent application Ser. No. 10/775,646, entitled "Improved Prism Array for Electron Beam Inspection and Defect Review," filed Feb. 10, 2004 by inventor Marian Mankos, the disclosure of which is hereby incorporated by reference in its entirety. A uniform magnetic field provides astigmatic focusing wherein focusing occurs in only one direction (for example, so as to image a point as a line). In contrast, the magnetic prism 106 configuration should focus in both directions (so as to image a point as a point) because the prism 106 is also utilized for imaging. The stigmatic focusing of the prism 106 may be implemented by dividing it into smaller sub-regions with different but uniform magnetic fields. Furthermore, the lens elements in the prism 106 may be of a relatively longer length and width so as to provide for a low distortion image over a large field size. However, increasing the length of the prism 106 involves a trade-off of more electron-electron interactions causing more blur. Hence, the reduced image distortion should be balanced against the increased blur when increasing the prism length.

Below the magnetic prism 106, the electron-optical components of the objective optics are common to the illumination and projection subsystems. The objective optics may be configured to include the objective lens 110 and one or more transfer lenses (not shown). The objective optics receives the incident beam from the prism 106 and decelerates and focuses the incident electrons as they approach the DPG 112. The objective optics is preferably configured (in cooperation with the gun 102, illumination optics 104, and prism 106) as an immersion cathode lens and is utilized to deliver an effectively uniform current density (i.e. a relatively homogeneous flood beam) over a large area in a plane above the surface of the DPG 112. In one specific implementation, the objective lens 110 may be implemented to operate with a system operating voltage of 50 kilovolts. Other operating voltages may be used in other implementations.

The dynamic pattern generator 112 comprises an array of pixels. Each pixel may comprise a metal contact to which a voltage level is controllably applied. The principle of operation of the DPG 112 is described further below in relation to FIGS. 3A and 3B.

The extraction part the of the objective lens 110 provides an extraction field in front of the DPG 112. As the reflected electrons 113 leave the DPG 112, the objective optics is configured to accelerate the reflected electrons 113 toward their second pass through the prism 106. The prism 106 is configured to receive the reflected electrons 113 from the transfer lens 108 and to bend the trajectories of the reflected electrons towards the projection optics 114.

The projection electron-optics 114 reside between the prism 106 and the wafer stage 116. The projection optics 114 is configured to focus the electron beam and demagnify the beam onto photoresist on a wafer or onto another target. The demagnification may range, for example, from 1× to 20×demagnification (i.e. 1× to 0.05× magnification). The blur and distortion due to the projection optics 114 is preferably a fraction of the pixel size. In one implementation, the pixel size may be, for example, 22.5 nanometers (nm). In such a case, the projection optics 114 preferably has aberrations and distortions of less than 10–20 nm.

The wafer stage 116 holds the target wafer. In one embodiment, the stage 116 is stationary during the lithographic projection. In another embodiment, the stage 116 is in linear motion during the lithographic projection. In the case where the stage 116 is moving, the pattern on the DPG 112 may be dynamically adjusted to compensate for the motion such that the projected pattern moves in correspondence with the wafer movement. In other embodiments, the REBL system 100 may be applied to other targets besides semiconductor wafers. For example, the system 100 may be applied to reticles. The reticle manufacturing process is similar to the process by which a single integrated circuit layer is manufactured.

Figure 2:
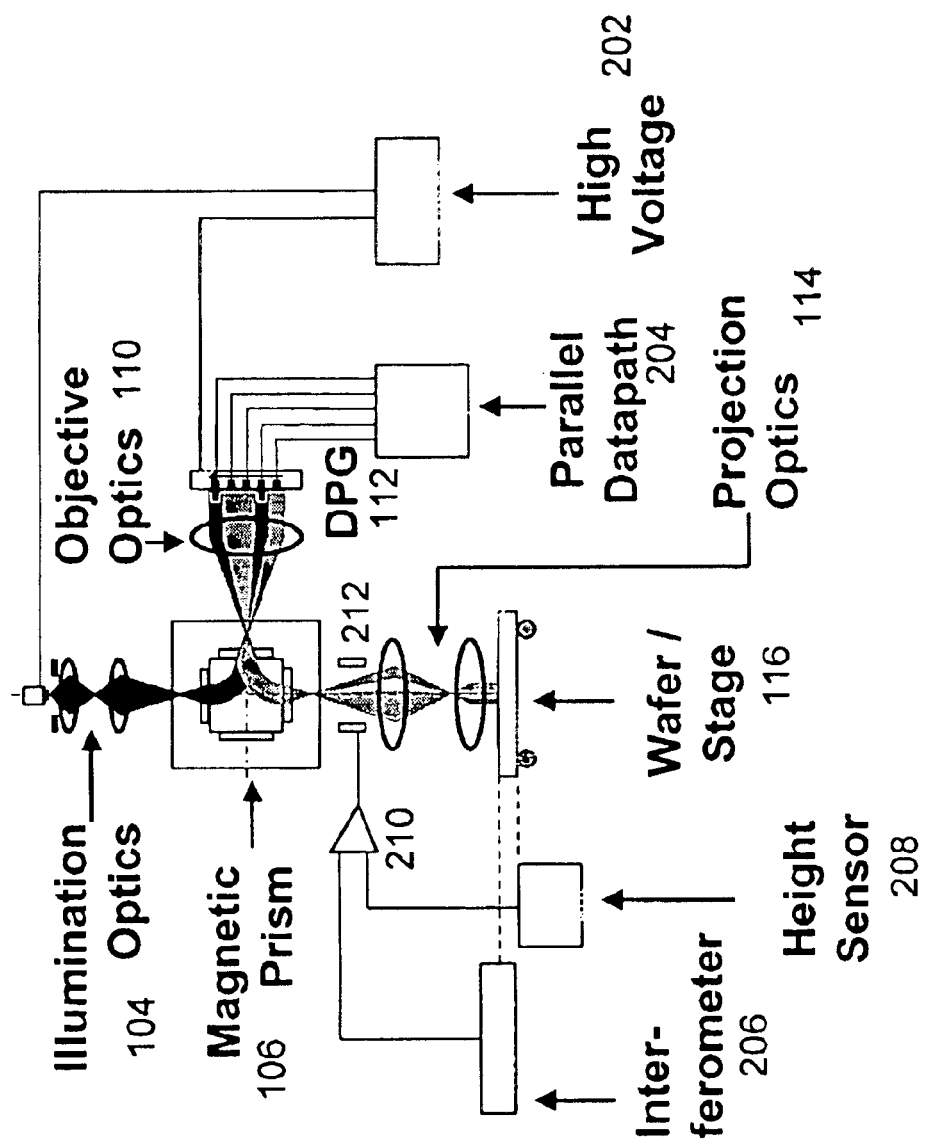
FIG. 2 is a schematic diagram of a maskless reflection electron beam projection lithography system showing further components in accordance with an embodiment of the invention.

FIG. 2 is a schematic diagram of a maskless reflection electron beam projection lithography system 200 showing further components in accordance with an embodiment of the invention. The additional components illustrated include a high voltage source 202, a parallel datapath 204, an interferometer 206, a height sensor 208, feedback circuitry 210, and beam deflectors 212.

The high voltage source 202 is shown as providing a high voltage to the source 102 and to the DPG 112. The voltage provided may be, for example, 50 kilovolts. The parallel data path 204 is configured to carry control signals to the DPG 112 for controlling the voltage on each pixel (so that it either absorbs electrons or reflects them).

In one embodiment, the control signals are adjusted so that the pattern moves electronically across the DPG pixel array in a manner that is substantially the same as the way signals move through a shift register and at a rate so as to match the linear movement of the wafer. In this embodiment, each exposed point on the wafer may receive reflected electrons from an entire column (or row) of DPG pixels, integrated over time. In one implementation of this embodiment, the DPG 112 is configured to resemble a static random access memory (SRAM) circuit, such as that depicted in FIG. 4.

In another embodiment, the control signals are such that the DPG 112 exposes one complete frame at a time. In this embodiment, each pixel on the DPG 112 exposes a corresponding pixel on the wafer. The pattern on the DPG 112 remains constant during the exposure of each frame. In one implementation of this embodiment, the DPG 112 is configured to resemble a dynamic random access memory (DRAM) circuit, such as that depicted in FIG. 5.

The interferometer 206 may be included to provide tight coupling and positional feedback between the electron beam location and the target on the wafer. In one embodiment, the optical beams are reflected off mirrors on the stage. The resulting interference pattern depends on the difference of the individual beam paths and allows accurate measurement of the stage and wafer position. As further described below in relation to FIG. 6, optical beams from the interferometer are diffracted from a grating on the target substrate surface, the resultant interference pattern is sensitive to the phase of the grating and can therefore deliver lateral positional information. Vertical positional information may be provided by a height sensor 208. The positional information may be fed back via feedback circuitry 210 so as to control beam deflectors 212. The deflectors 212 are configured to deflect the projected beam so as to compensate for vibrations and positional drift of the wafer.

Figure 3:
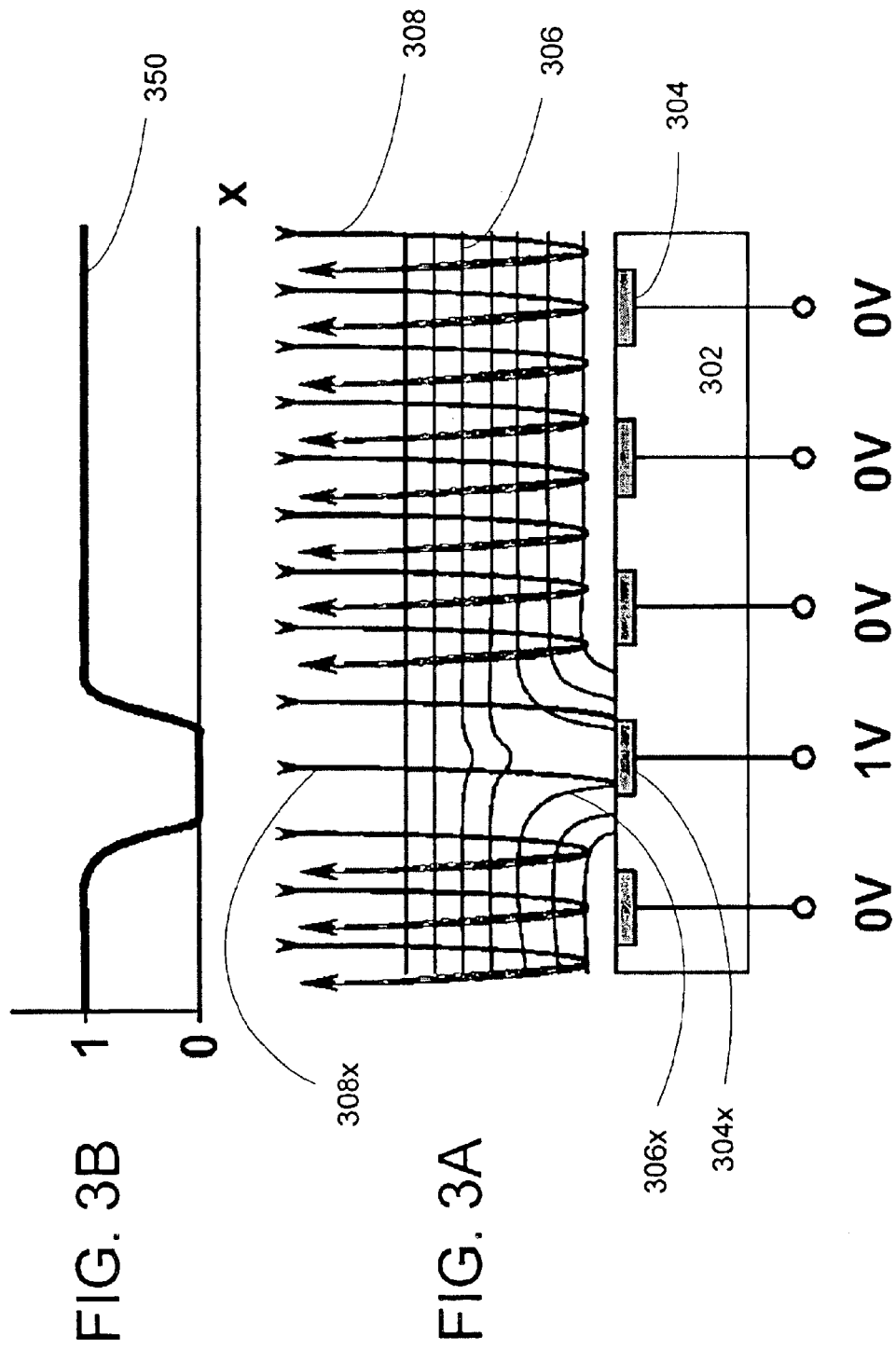
FIGS. 3A and 3B are diagrams illustrating the operation of a dynamic pattern generator in accordance with an embodiment of the invention.

FIGS. 3A and 3B are diagrams illustrating the operation of a dynamic pattern generator in accordance with an embodiment of the invention. FIG. 3A shows a cross-section of a DPG substrate 302 showing a column (or row) of pixels. Each pixel includes a conductive area 304. A controlled voltage level is applied to each pixel. In the example illustrated in FIG. 3A, four of the pixels are "off" and have zero (0) volts applied thereto, while one pixel (with conductive area labeled 304x) is "on" and has one (1) volt applied thereto. (The specific voltages may vary depending on the parameters of the system.) The resultant local electrostatic equipotential lines 306 are shown, with distortions 306x relating to "off" pixel shown. In this example, the incident electrons 308 approaching the DPG 112 come to a halt in front of and are reflected by each of the "on" pixels, but the incident electrons 308x are drawn into and absorbed by the "off" pixel. The resultant reflected current (in arbitrary units) is shown in FIG. 3B. As seen from FIG. 3B, the reflected current is "0" for the "off" pixel and "1" for the "on" pixels.

Figure 4:
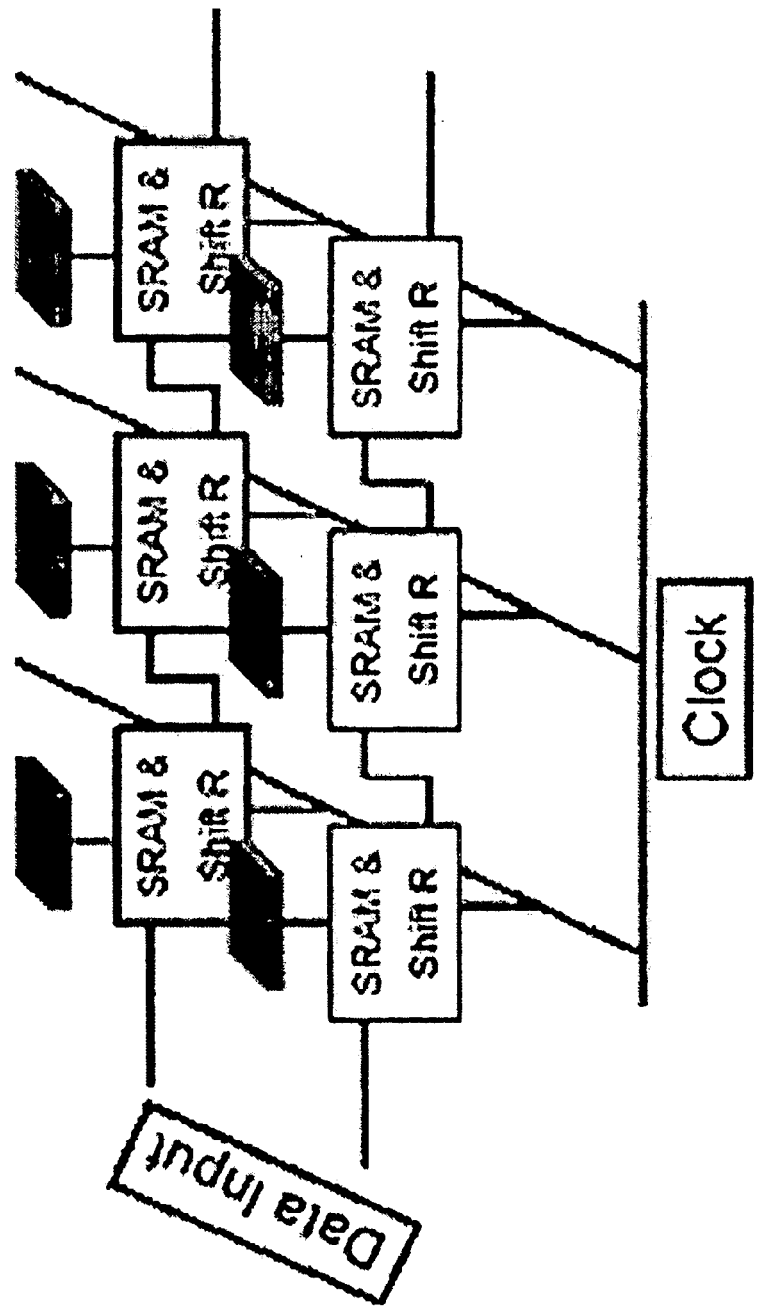
FIG. 4 is a schematic diagram of a dynamic pattern generator implemented in a circuit structure resembling a SRAM in accordance with an embodiment of the invention.

FIG. 4 is a schematic diagram of a dynamic pattern generator 212 implemented in a circuit structure resembling a SRAM in accordance with an embodiment of the invention. In one embodiment, the SRAM-like DPG 212 is used in a "rolling mode" wherein the lithographic pattern is moved from one row of pixels into the next at the same rate at which the wafer scans. To expose a spot on the photoresist on a wafer, each pixel turns "on" (i.e. become reflective) as the spot passes "beneath" the pixel.

Figure 5:
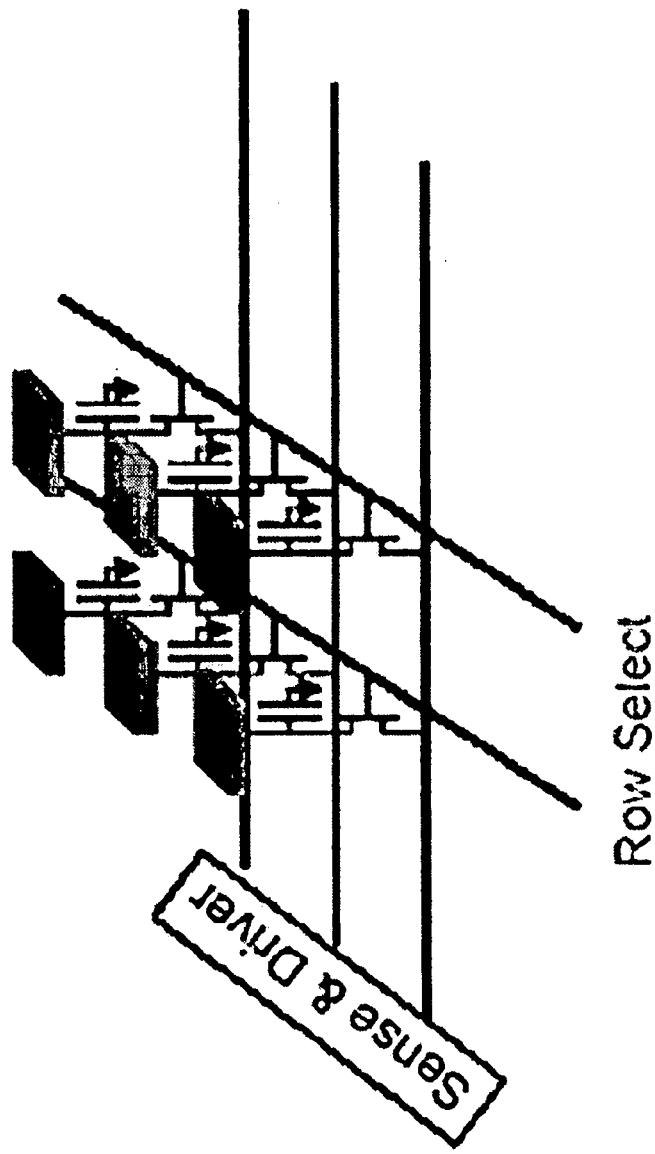
FIG. 5 is a schematic diagram of a dynamic pattern generator implemented in a circuit structure resembling a DRAM in accordance with an embodiment of the invention.

FIG. 5 is a schematic diagram of a dynamic pattern generator 212 implemented in a circuit structure resembling a DRAM in accordance with an embodiment of the invention. Here, each pixel may be implemented with as few as one transistor and one capacitor, so smaller pixels may be implemented. In one embodiment, the DRAM-like DPG 112 is used in "frame" (or "step and flash") mode. In frame mode, the DPG 112 exposes one frame at a time. Each DPG pixel exposes a corresponding pixel on the wafer, and the pattern on the DPG 112 remains constant during the exposure of each frame.

As described above, the DPG 112 comprises a programmable pattern generator structure. In an alternate embodiment, the system 100 may utilize a static patterned structure. As described above, the DPG 112 is utilized to generate a pattern with pixels either on or off. In an alternate embodiment, gray scale values for the pixels may be implemented. Gray scale values may be implemented, for example, by using a finer range of voltage values so as to provide control over the percentage (between 0% and 100%) of electrons reflected by a pixel. Alternatively, gray scale values may be implemented by varying the percentage of time over which each pixel remains on.

Figure 6:
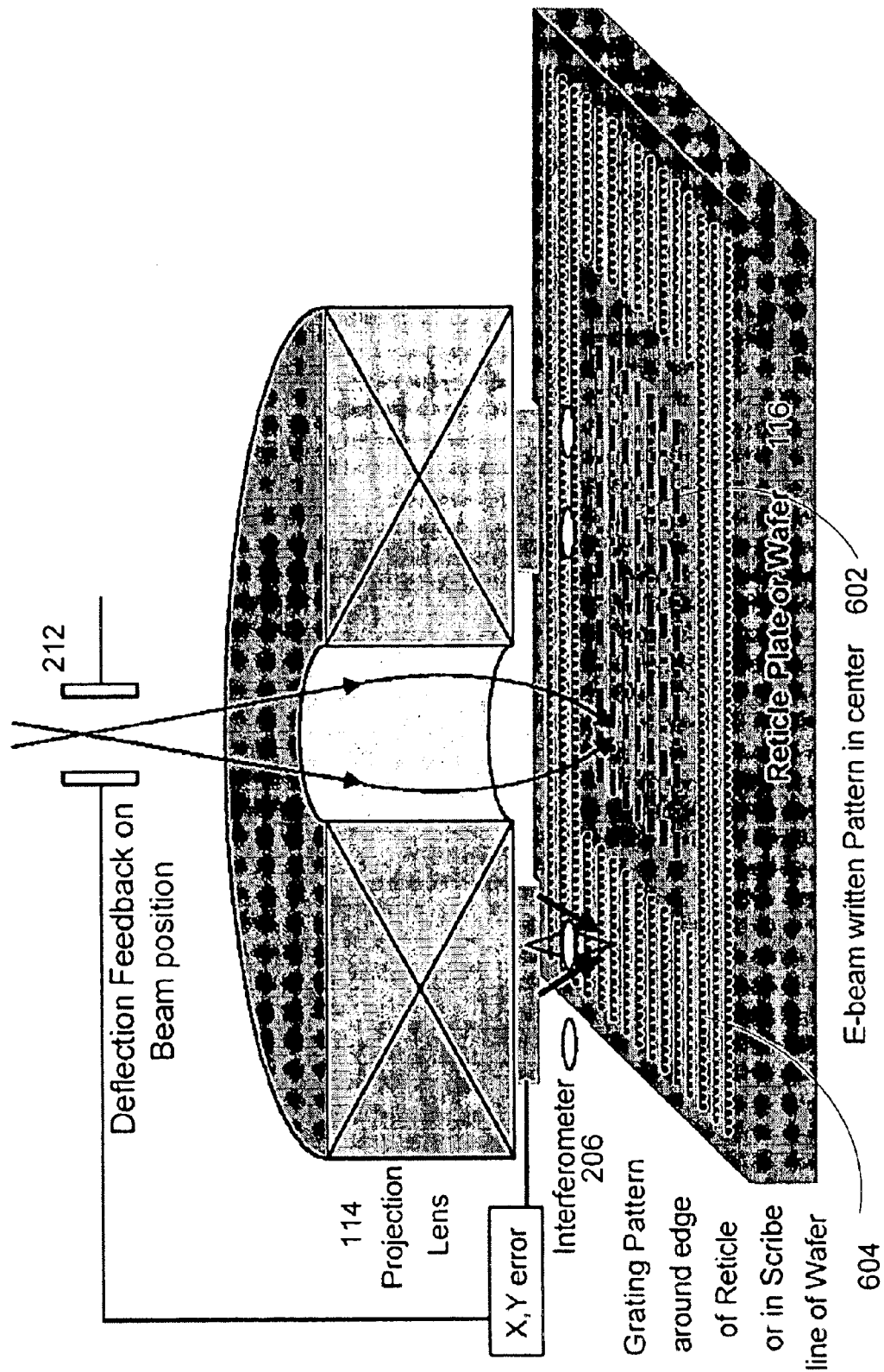
FIG. 6 is a schematic diagram depicting a feedback loop system for controlling beam position in accordance with an embodiment of the invention.

FIG. 6 is a schematic diagram depicting a feedback loop system for controlling electron beam position in accordance with an embodiment of the invention. Here, the electron beam is used to write a pattern 602 in a center portion of a reticle plate or wafer. As shown, the feedback loop system may be implemented using a low-profile waveguided interferometer attached to the projection lens. Dual incident laser beams may be diffracted from a grating pattern 604 into a common first-order axial beam. The resultant interference pattern is sensitive to the phase of the grating and can therefore deliver lateral (both x and y) positional information with sub-nanometer resolution. The grating pattern 604 may be, for example, placed around the edge of a reticle or in the scribe lines on a wafer. The grating pattern 604 may be implemented as a latent image on the photoresist, or as a feature inscribed on the periphery of a bare wafer or reticle blank. The system feeds back positional information to deflectors that steer the electon beam so as to cancel vibrations and positional drift.

In accordance with another embodiment of the invention, a flat or ribbon electron beam is generated by the illumination electron optics. This ribbon type beam may have an aspect ratio of, for example, 1000:1 or 2000:1 so as to be substantially one dimensional. The reflective array may be a one-dimensional array. Advantageously, the one-dimensional reflective array and clocking signals for it may be simpler to implement.

In a first implementation, the ribbon-like beam may be formed by adding quadrupole lenses and/or one-dimensional electrostatic lenses to the illumination electron optics and by tuning the magnification in the x and y planes to achieve the ribbon-like incident beam. In such an implementation, the projection electron optics may be similar as for a system with a two-dimensional beam. This approach advantageously requires more accurate focusing in only one dimension, but it may add further space-charge limitations.

In a second implementation, the ribbon-like beam may be formed by adding quadrupole lenses and/or one-dimensional electrostatic lenses to the projection electron optics. In this implementation, the illumination electron optics may be similar as for a system with a two-dimensional beam. This implementation advantageously does not add space charge limitations, but this approach requires more accurate focusing in both dimensions.

In a third implementation, the asymmetry may be split between the illumination optics and the projection optics. In one specific design, the illumination optics may be designed to produce an elongated illumination spot of 100:1 at the reflective array, and the projection optics may be designed with a demagnification of 10 times more in the elongated dimension so as to achieve a final 1000:1 aspect ratio. This approach would not add less space-charge limitations than the first implementation. For this compromise approach, the non-axisymmetric elements (quadrupole lenses, one-dimensional electrostatic lenses, and/or magnetic bends) may be implemented either in the illumination and projection arms separately, or may be implemented in the region between the prism and the reflective array (which effectively adds the elements to both arms).

The above-described diagrams are not necessarily to scale and are intended be illustrative and not limiting to a particular implementation. In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus for reflection electron beam lithography, the apparatus comprising:
    an electron source configured to emit electrons;
    an electron reflective patterned structure having at least two voltage levels applied thereto; and
    a stage to hold a target substrate,
    wherein electrons are reflected to the target substrate by portions of the patterned structure having a lower voltage level and are absorbed by portions of the patterned structure having a higher voltage level.

2. The apparatus of claim 1, further comprising:
    illumination electron-optics configured to receive the emitted electrons and form an incident electron beam therefrom.

3. The apparatus of claim 2, further comprising:
    a beam separator configured to redirect the incident electron beam towards the patterned structure.

4. The apparatus of claim 3, wherein the beam separator comprises a magnetic prism.

5. The apparatus of claim 4, wherein the magnetic prism is configured to produce a non-uniform magnetic field so as to provide stigmatic focusing.

6. The apparatus of claim 3, further comprising:
    objective electron-optics configured to receive the redirected incident electron beam and to decelerate and focus the incident electron beam such that the electrons reflect approximately at a plane just above the patterned structure.

7. The apparatus of claim 1, wherein the patterned structure comprises a dynamic pattern generator.

8. The apparatus of claim 7, wherein the dynamic pattern generator comprises a SRAM-type array of elements.

9. The apparatus of claim 8, wherein the SRAM-type array of elements is operated in a rolling mode with a moving target substrate.

10. The apparatus of claim 7, wherein the dynamic pattern generator comprises a DRAM-type array of elements.

11. The apparatus of claim 10, wherein the DRAM-type array of elements is operated in a frame mode with a stationary target substrate.

12. The apparatus of claim 1, wherein the patterned structure comprises a static patterned structure.

13. The apparatus of claim 1, wherein gray scale levels are implemented at the patterned structure.

14. The apparatus of claim 13, wherein the gray scale levels are implemented by varying a time over which a voltage level is applied to an element of the patterned structure.

15. The apparatus of claim 13, wherein the gray scale levels are implemented by fine voltage level variations.

16. The apparatus of claim 1, wherein the target substrate comprises a semiconductor wafer having a photoresist layer thereon.

17. The apparatus of claim 1, wherein the target substrate comprises a reticle blank having a photoresist layer thereon.

18. The apparatus of claim 1, wherein the apparatus is configured to project a highly-elongated patterned electron beam onto the target substrate.

19. The apparatus of claim 18, further comprising illumination electron optics configured to elongate an electron beam incident to the patterned structure.

20. The apparatus of claim 18, further comprising projection electron optics configured to elongate an electron beam reflected from the patterned structure.

21. The apparatus of claim 18, further comprising illumination electron optics configured to elongate an electron beam incident to the patterned structure and projection electron optics configured to further elongate the electron beam after reflection from the patterned structure.

22. The apparatus of claim 18, further comprising objective electron optics configured to elongate an electron beam incident to the patterned structure and to further elongate the electron beam after reflection from the patterned structure.

23. An apparatus for generating a pattern of charged particles, the apparatus comprising:

a charged-particle source configured to emit electrons;

an opaque patterned structure having at least two voltage levels applied thereto; and a stage to hold a target substrate, wherein the charged particles are reflected to the target substrate by portions of the patterned structure having a lower voltage level and are absorbed by portions of the patterned structure having a higher voltage level.

24. A method of electron beam lithography, the method comprising:

forming an incident electron beam;

directing the incident electron beam to an opaque patterned structure;

reflecting electrons from portions of the patterned structure having a lower voltage level applied thereto;

absorbing electrons from other portions of the patterned structure having a higher voltage level applied thereto; and directing the reflected electrons towards a target substrate to imprint a lithographic pattern.

25. The method of claim 24, wherein a magnetic prism is utilized to direct both the incident electron beam and the reflected electrons.

26. The method of claim 24, further comprising:

dynamically changing a voltage pattern on the patterned structure so as to change a corresponding pattern of reflected electrons.

27. The method of claim 26, wherein the pattern of reflected electrons comprises an on/off pattern.

28. The method of claim 26, wherein the pattern of reflected electrons comprises a gray scale pattern.

29. The method of claim 26, wherein the voltage pattern is dynamically changed in a rolling manner in correspondence to relative movement of the substrate.

30. The method of claim 26, wherein the voltage pattern is dynamically changed in a step and flash manner.

31. The method of claim 24, wherein the reflected electrons impinge upon a photoresist layer on the substrate in a pattern that corresponds to a voltage pattern on the patterned structure.

32. The method of claim 24, wherein the lithographic pattern imprinted comprises a two-dimensional array of pixels.

33. The method of claim 24, wherein the lithographic pattern imprinted comprises a one-dimensional line of pixels.

34. A system for generating a pattern of electrons and impinging the pattern onto a target substrate, the system comprising:

means for forming an incident electron beam;

means for directing the incident electron beam to an opaque patterned structure;

means for reflecting electrons from portions of the patterned structure having a lower voltage level applied thereto;

means for absorbing electrons from other portions of the patterned structure having a higher voltage level applied thereto; and means for directing the reflected electrons towards the target substrate.

* * * * *

UNITED STATES PATENT AND TRADEMARK OFFICE
CERTIFICATE OF CORRECTION

PATENT NO. : 6,870,172 B1
DATED : March 22, 2005
INVENTOR(S) : Mankos et al.

It is certified that error appears in the above-identified patent and that said Letters Patent is hereby corrected as shown below:

<u>Column 1,</u>
Line 3, before the "BACKGROUND OF THE INVENTION", insert
-- GOVERNMENT LICENSE RIGHTS
The U.S. Government has a paid-up license in this invention and the right in limited circumstances to require the patent owner to license others on reasonable terms as provided for by the terms of Contract No. DAAD19-00-3-1001 awarded by the Defense Advanced Research Projects Agency. --

Signed and Sealed this

Twelfth Day of July, 2005

JON W. DUDAS
*Director of the United States Patent and Trademark Office*